(12) United States Patent
Dornbusch et al.

(10) Patent No.: US 8,222,721 B2
(45) Date of Patent: Jul. 17, 2012

(54) INTEGRATED CIRCUIT SUITABLE FOR USE IN RADIO RECEIVERS

(75) Inventors: Andrew W. Dornbusch, Austin, TX (US); Charles D. Thompson, Buda, TX (US)

(73) Assignee: Silicon Laboratories Inc., Austin, TX (US)

( * ) Notice: Subject to any disclaimer, the term of this patent is extended or adjusted under 35 U.S.C. 154(b) by 1481 days.

(21) Appl. No.: 10/691,212

(22) Filed: Oct. 21, 2003

(65) Prior Publication Data

US 2005/0056950 A1   Mar. 17, 2005

Related U.S. Application Data

(60) Provisional application No. 60/503,010, filed on Sep. 15, 2003.

(51) Int. Cl.
*H01L 23/02* (2006.01)
(52) U.S. Cl. .............. 257/686; 257/E25.018; 257/777; 257/778; 333/193; 333/194; 438/109
(58) Field of Classification Search .............. 257/678, 257/684, 693, 698, 728, 787, E23.052, E23.079, 257/786, 778, 686; 438/106, 121, 109; 333/133, 333/193–196; 310/313
See application file for complete search history.

(56) References Cited

U.S. PATENT DOCUMENTS

| 3,868,608 | A | * | 2/1975 | Williams | 333/193 |
|---|---|---|---|---|---|
| 4,296,391 | A | * | 10/1981 | Hazama et al. | 333/193 |
| 5,459,368 | A | * | 10/1995 | Onishi et al. | 310/313 R |
| 5,512,783 | A | * | 4/1996 | Wakefield et al. | 257/693 |
| 5,576,589 | A | * | 11/1996 | Dreifus et al. | 310/313 A |
| 5,991,185 | A | * | 11/1999 | Hachiya | 365/63 |
| 6,107,681 | A | | 8/2000 | Lin | |
| 6,320,201 | B1 | * | 11/2001 | Corbett et al. | 257/48 |
| 6,329,715 | B1 | * | 12/2001 | Hayashi | 257/724 |
| 6,339,365 | B1 | * | 1/2002 | Kawase et al. | 333/193 |
| 6,396,154 | B1 | * | 5/2002 | Hikita et al. | 257/778 |
| 6,424,027 | B1 | * | 7/2002 | Lamson et al. | 257/676 |
| 6,525,609 | B1 | | 2/2003 | Behzad | |
| 6,580,163 | B2 | * | 6/2003 | Poulin | 257/678 |
| 6,683,515 | B1 | * | 1/2004 | Nakamura et al. | 333/193 |
| 2002/0113309 | A1 | * | 8/2002 | Fazelpour | 257/728 |

OTHER PUBLICATIONS

Analog Devices, Inc. CDMA 3 V Receiver IF Subsystem with Integrated Voltage Regulator, p. 1-16, Rev. B, Norwood, MA, 2000.

(Continued)

*Primary Examiner* — Chris Chu
(74) *Attorney, Agent, or Firm* — Polarisky & Associates, P.L.L.C.; Paul J. Polansky (57) ABSTRACT

An integrated circuit (500) includes a semiconductor substrate (400) and an integrated circuit package (530). The semiconductor substrate (400) has a first pair of bonding pads (442, 444) conducting a differential output signal thereon and adapted to be coupled to an input of a first external filter, and a second pair of bonding pads (452, 454) conducting a differential input signal thereon and adapted to be coupled to an output of said first external filter. The integrated circuit package (530) encapsulates the semiconductor substrate (400) and has first (452, 454) and second (552, 554) terminal pairs corresponding and coupled to the first (442, 444) and second (452, 454) pairs of bonding pads, respectively. The first (452, 454) and second (552, 554) terminal pairs are separated by a first predetermined distance is sufficient to maintain an input-to-output isolation therebetween of at least a first predetermined amount.

26 Claims, 4 Drawing Sheets

OTHER PUBLICATIONS

Infineon Technologies, Wireless Components, ASK Single Conversion Receiver 390MHz, TDA 5204 E1, Version 1.0, Specification, Dec. 2000.

Colin K. Campbell, Ph. D., D.Sc. Understanding Surface Acoustic Wave (SAW) Devices for Mobile and Wireless Applications and Design Techniques, Session 14: "An Overview of SAW Devices for Mobile/Wireless Communications", 2003.

EPCOS, SAW Components, Data Sheet Y 7103, Jun. 14, 2000, p. 2-5, Michigan.

* cited by examiner

FIG. 5 ured using zinc oxide ($ZnO_2$), a mate-
INTEGRATED CIRCUIT SUITABLE FOR USE IN RADIO RECEIVERS

CROSS-REFERENCE TO RELATED APPLICATIONS

This application claims the benefit of U.S. Provisional Application No. 60/503,010, filed Sep. 15, 2003, which is incorporated herein by reference in its entirety.

TECHNICAL FIELD

The present invention generally relates to communication systems, and more particularly to integrated circuits useful in radio receivers.

BACKGROUND

Radio frequency (RF) devices transmit an information signal from one point to another by moving the information signal to a higher frequency range that is more suitable for transmission over the medium being used. This process is known as upconversion. As used herein, "radio frequency signal" means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. An RF transmitter mixes the desired signal, known as the baseband signal, with an RF carrier frequency for transmission over the selected medium. An RF receiver then mixes the signal with the carrier frequency to restore the signal to its original frequency.

A superheterodyne receiver is a receiver that mixes the desired data-carrying signal with the output of tunable oscillator to produce an output at a fixed intermediate frequency (IF). The fixed IF signal can then be conveniently filtered and converted back down to baseband for further processing. Superheterodyne receivers are useful in a wide variety of applications in which the desired channel can occur within a wide band of frequencies, such as AM and FM radio, satellite radio, etc.

To reduce the cost of a superheterodyne radio receiver, it is useful to combine as many circuit elements as possible into a single integrated circuit (IC). While contemporary CMOS technology can operate fast enough to process RF and IF signals, certain other functions cannot be easily integrated into CMOS processes. For example, inductors and capacitors may be fabricated on low-cost CMOS ICs to form LC filters, but LC filters do not provide a very good frequency response to filter the selected IF. Another known type of filter that provides better channel selectivity than an LC filter is known as a surface acoustic wave (SAW) filter. A SAW filter is a piezoelectric device that converts an electrical signal to a mechanical vibration signal and then back to an electrical signal. Filtering is achieved through the interaction of signal transducers in the conversion process. However a filter of this type is typically constructed using zinc oxide ($ZnO_2$), a material that is as yet incompatible with integration on a CMOS circuit utilizing a silicon substrate. Thus there still exists a need for integrated circuits suitable for use in an inexpensive, high-quality superheterodyne receiver or the like.

BRIEF SUMMARY

An integrated circuit includes a semiconductor substrate and an integrated circuit package. The semiconductor substrate has a first pair of bonding pads conducting a differential output signal thereon and adapted to be coupled to an input of a first external filter, and a second pair of bonding pads conducting a differential input signal thereon and adapted to be coupled to an output of the first external filter. The integrated circuit package encapsulates the semiconductor substrate and has first and second terminal pairs corresponding and coupled to the first and second pairs of bonding pads, respectively. The first and second terminal pairs are separated by a first predetermined distance is sufficient to maintain an input-to-output isolation therebetween of at least a first predetermined amount.

In another form an integrated circuit includes a semiconductor substrate and an integrated circuit package and the semiconductor substrate has first, second, third, and fourth quadrants having respective first, second, third, and fourth bonding pads located therein. The semiconductor substrate includes a first circuit adapted to be coupled to a first external filter coupled to the first circuit through the first and second bonding pads, and a second circuit adapted to be coupled to a second external filter coupled to the second circuit through the third and fourth bonding pads. The integrated circuit package encapsulates the semiconductor substrate and has first, second, third, and fourth terminals corresponding and coupled to the first, second, third, and fourth bonding pads, respectively.

In yet another form an integrated circuit includes a semiconductor substrate and an integrated circuit package and the semiconductor substrate has a first pair of bonding pads conducting a differential output signal thereon and adapted to be coupled to an input of an external filter, and a second pair of bonding pads conducting a differential input signal thereon and adapted to be coupled to an output of the external filter. The integrated circuit package encapsulates the semiconductor substrate and has at least first and second sides, and comprises a first pair of terminals located at a first end of the first side and coupled to the first pair of bonding pads, and a second pair of terminals located at a second end of the first side opposite the first end and coupled to the second pair of bonding pads.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
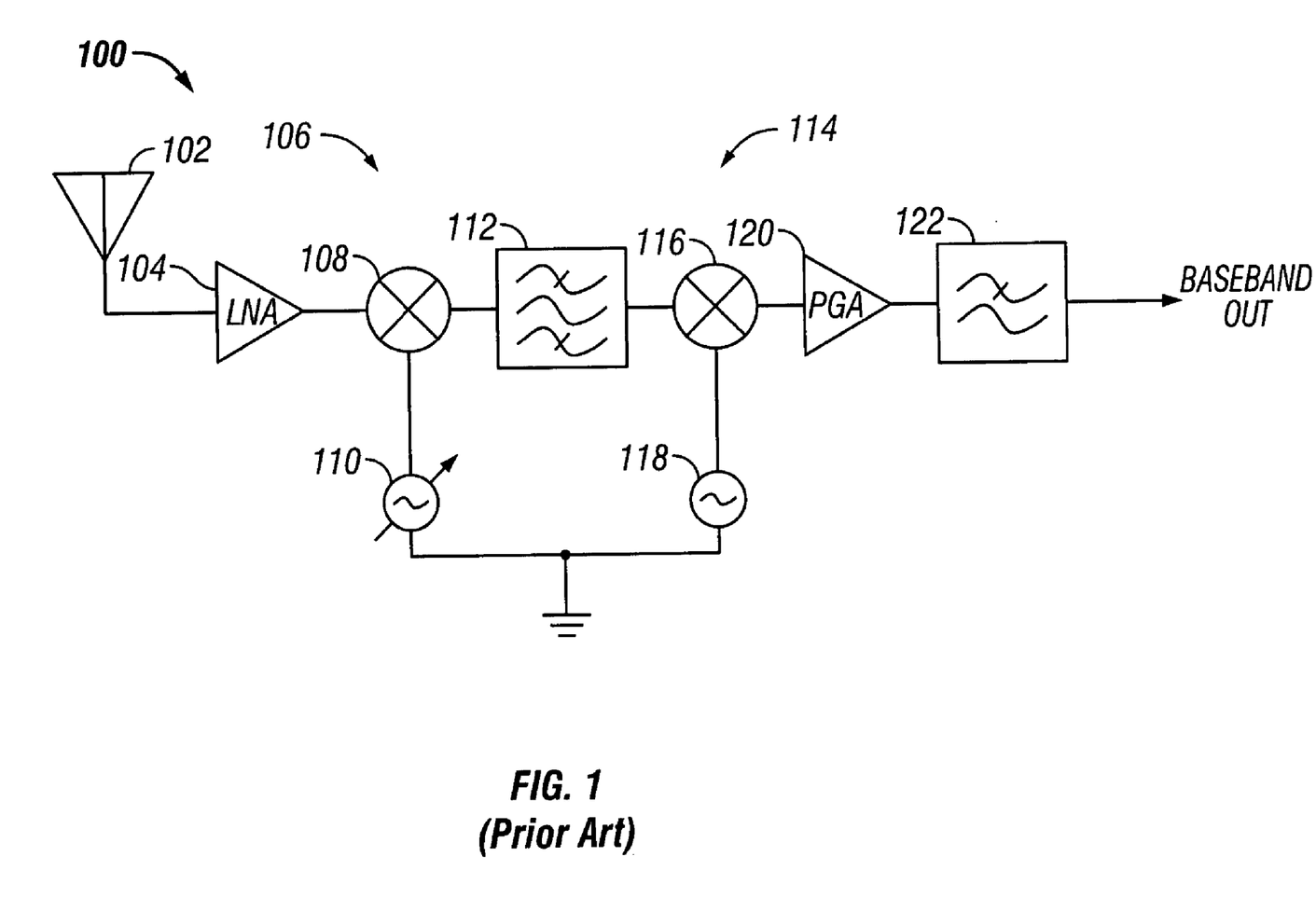
FIG. 1 illustrates in partial block diagram and partial schematic form a radio receiver known in the prior art.

FIG. 1 illustrates in partial block diagram and partial schematic form a radio receiver 100 known in the prior art. Receiver 100 is a superheterodyne receiver that includes generally an antenna 102, a low noise amplifier labeled "LNA" 104, an RF to IF mixer 106, a bandpass filter 112, an IF to baseband mixer 114, a programmable gain amplifier labeled "PGA" 120, and a lowpass filter 122. Amplifier 104 has an input terminal connected to antenna 102, and an output terminal, and amplifies a broadband signal received on antenna 102 to provide an amplified signal to the output terminal thereof. Mixer 106 mixes the amplified signal to IF as follows. Mixer 106 includes a multiplier 108 and a tunable oscillator 110. Multiplier 108 has a first input terminal connected to the output terminal of amplifier 104, a second input terminal, and an output terminal. Tunable oscillator 110 has a tuning input terminal and an output terminal that provides an RF local oscillator (LO) signal referenced to a ground voltage received at a ground terminal thereof. The RF LO signal is selected by the tuning input to have a frequency such that a desired channel is mixed from RF to a selected IF, which is also the center frequency of bandpass filter 112. Bandpass filter 112 has an input terminal connected to the output terminal of multiplier 108, and an output terminal for providing an output signal with significant signal energy in a passband centered around the chosen IF, and with significant attenuation of signal energy in a stopband outside the passband.

This signal at the output of bandpass filter 112 is then mixed to baseband in mixer 114. Mixer 114 includes a multiplier 116 and an oscillator 118. Multiplier 116 has a first input terminal connected to the output terminal of bandpass filter 112, a second input terminal, and an output terminal. Oscillator 118 provides an IF LO signal between an output terminal thereof and ground received at a ground terminal. The IF LO signal is selected to have an output frequency chosen to mix the selected IF signal to baseband, and multiplier 116 thus provides the output signal thereof at baseband. Amplifier 120 is provided to amplify this signal to a desired level, and has an input terminal connected to the output terminal of multiplier 116, and an output terminal. Filter 122 has an input terminal connected to the output terminal of amplifier 120, and an output terminal for providing an output signal of receiver 100 labeled "BASEBAND OUT".

Receiver 100 is a conventional superheterodyne receiver. To provide high channel selectivity, bandpass filter 112 may be implemented with a SAW filter. An ideal SAW filter has zero attenuation in the passband, infinite attenuation in the stop band, and an infinitely small transition band. A practical SAW filter, however, is lossy and has a small attenuation in the passband, high finite attenuation in the stopband, and a reasonably narrow transition band. Even with these characteristics, practical SAW filters provide excellent characteristics compared with other types of bandpass filters such as inductor-capacitor (LC) filters.

Figure 2:
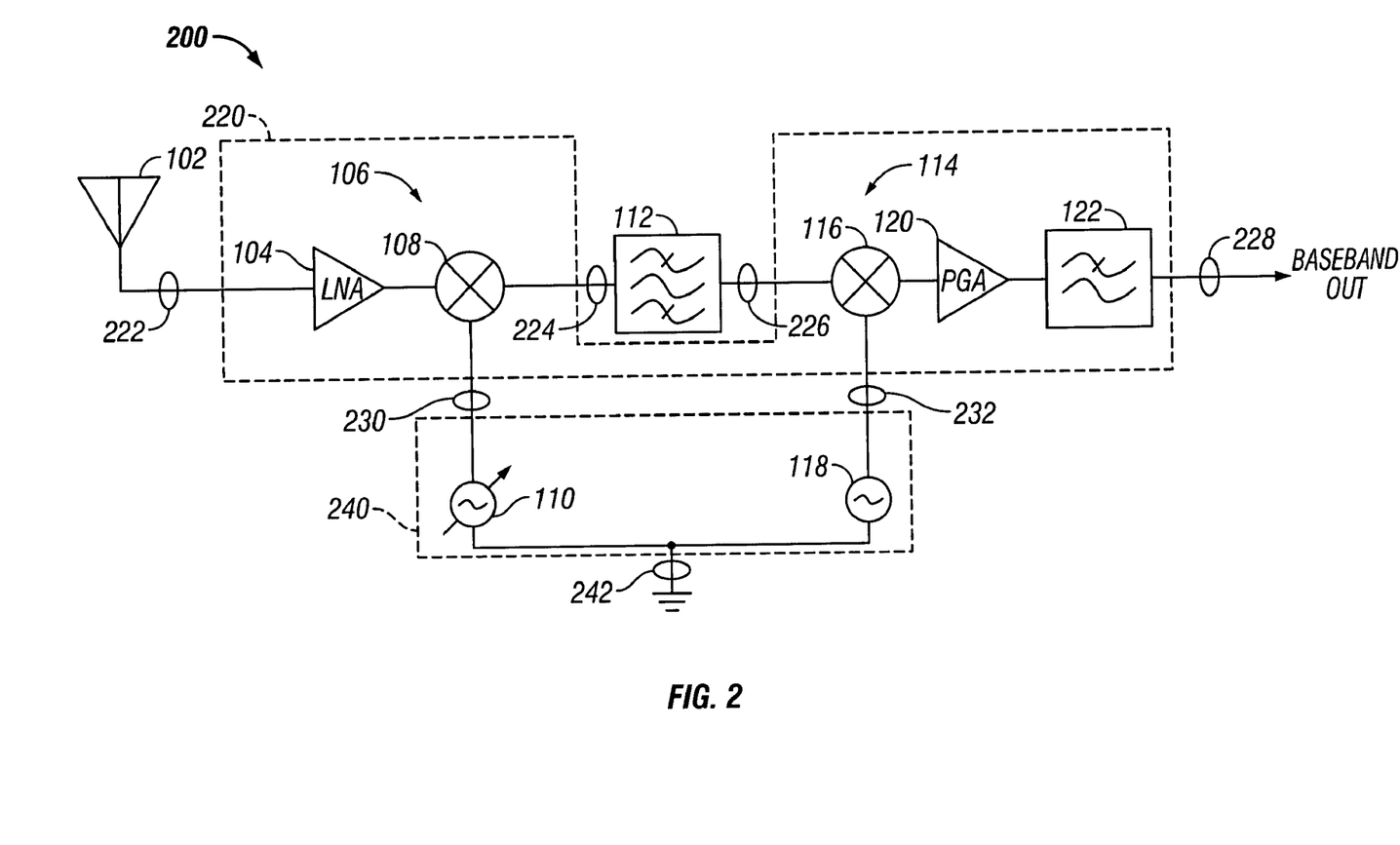
FIG. 2 illustrates in partial block diagram and partial schematic form a highly integrated radio receiver according to the present invention.

FIG. 2 illustrates in partial block diagram and partial schematic form a highly integrated radio receiver 200 according to the present invention. Receiver 200 implements the architecture of receiver 100 of FIG. 1 using a small number of components, including a receiver integrated circuit (IC) 220 and a frequency synthesizer IC 240. Receiver IC 220 is a complementary metal oxide semiconductor (CMOS) IC that includes amplifier 104, multiplier 108, multiplier 116, amplifier 120, and lowpass filter 122. Frequency synthesizer IC 240 is a CMOS IC that includes oscillators 110 and 118. Antenna 102 and bandpass filter 112 remain discrete components.

Receiver IC 220 includes an input terminal 222 for connection to external antenna 102, an output terminal 224 for connection to a corresponding input terminal of bandpass filter 112, an input terminal 226 for connection to a corresponding output terminal of bandpass filter 112, an output terminal 228 for providing the BASEBAND OUT signal, and input terminals 230 and 232 for receiving the RF LO signal and the IF LO signal, respectively. Frequency synthesizer IC 240 has output terminals corresponding to terminals 230 and 232, and a power supply terminal 242 connected to ground. Note that other IC terminals and other functional blocks, such as automatic gain control, sideband selection, etc. are not relevant to understanding the present invention and are omitted from FIG. 2.

By interfacing to external bandpass filter 112, receiver 200 is able to use the high channel selectivity properties of a SAW filter but still combine many other components that are suitable for integration in low-cost CMOS technology into only two ICs and two discrete components. In receiver 200, terminals 224 and 226 actually consist of two terminals each, conducting differential output and input signals, respectively.

Figure 3:
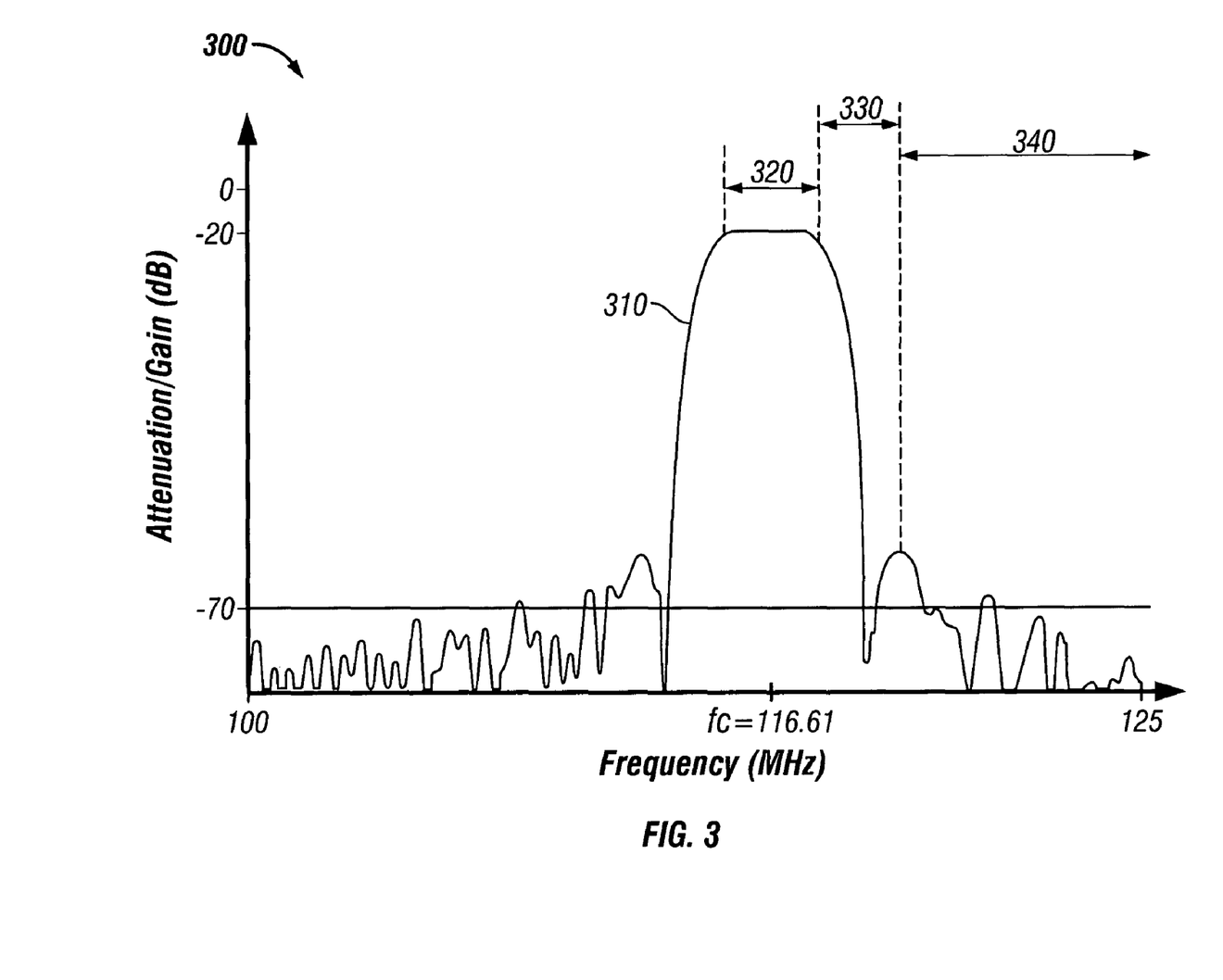
FIG. 3 illustrates a graph of the frequency domain attenuation characteristics of the SAW filter used in the receiver of FIG. 2.

The manner in which receiver IC 220 is integrated can be better understood with respect to FIG. 3, which illustrates a graph 300 of the frequency domain attenuation characteristics 310 of the SAW filter 112 used in the receiver of FIG. 2. Frequency domain attenuation characteristic 310 represents that of SAW Filter part no. Y7103L available from Epcos AG of Munich, Germany, In FIG. 3 the horizontal axis represents frequency in MHz and the vertical axis attenuation or gain with respect to the input signal in decibels (dB). From FIG. 3 it is seen that SAW filter 112 has a center frequency labeled "fc" of 116.61 MHz and a passband 320 of about 5 MHz. SAW filter 112 has a passband attenuation of about −20 dB, a transition band width 330 of about 2 MHz, and a stopband attenuation of approximately −70 dB occurring for frequencies higher than those in the transition band for example a stopband portion 340.

In order to use the excellent practical characteristic of SAW filter 112, the inventors discovered that the connections of receiver IC 220 could cause poor input-to-output isolation due to pin-to-pin coupling. Since differential signaling is preferably used, this undesirable signal coupling can occur between either the positive or negative signal of the differential signal pair and either signal of the other signal pair. However the characteristics of SAW filter 112 determine how much input-to-output pin isolation is desirable to avoid degrading performance. Thus receiver IC 220 isolates the SAW filter output and input pins by an appropriate amount as described further with reference to FIGS. 4-6 below.

Figure 4:
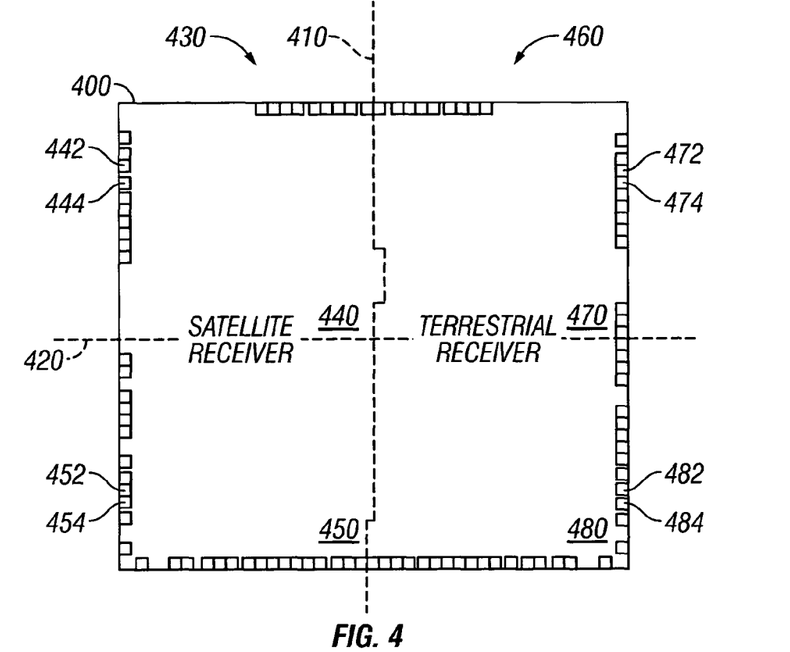
FIG. 4 illustrates a floor plan diagram of a semiconductor substrate using the receiver architecture of FIG. 2.

FIG. 4 illustrates a floor plan diagram of a semiconductor substrate 400 using the receiver architecture of FIG. 2. For use in a satellite radio, semiconductor substrate 400 actually includes both a satellite receiver and a terrestrial receiver and semiconductor substrate 400 can be divided approximately in half by a dividing line 410 into a satellite receiver 430 in a left portion and a terrestrial receiver 460 in a right portion. Both satellite receiver 430 and terrestrial receiver 460 implement the receiver architecture illustrated in FIG. 2, i.e. a superheterodyne receiver using an external SAW filter for IF bandpass filtering.

Semiconductor substrate 400 includes 99 bonding pads for conduction of power supply, ground, input, and output signals between semiconductor substrate 400 and external circuits through an integrated circuit package. More specifically, bonding pads 442 and 444 conduct a differential output signal to the external SAW filter associated with the satellite receiver through signal pins designated "SIFOP" and "SIFON", and bonding pads 452 and 454 conduct a differential input signal from this SAW filter through signal pins designated "SIFIP" and "SIFIN", in which S stands for satellite, IF stands for IF filter, I or O stand for input or output, and P or N stands for a positive or negative signal of a differential signal pair. Bonding pads 472 and 474 conduct a differential output signal to the external SAW filter associated with the terrestrial receiver through signal pins designated "TIFOP" and "TIFON", and bonding pads 482 and 484 conduct a differential input signal from this SAW filter through signal pins designated "TIFIP" and "TIFIN".

Figure 5:
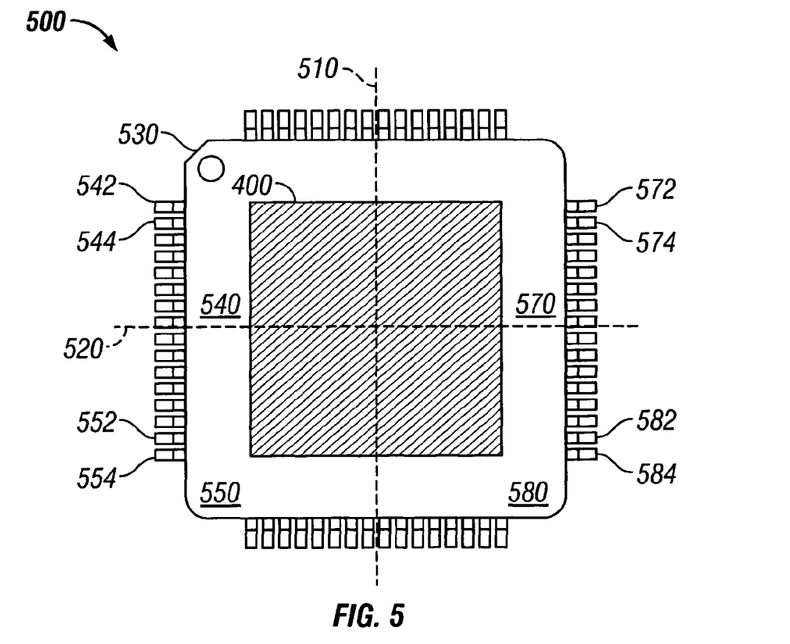
FIG. 5 illustrates a top view of a packaged IC including the semiconductor substrate of FIG. 4.

FIG. 5 illustrates a top view of an IC 500 including semiconductor substrate 400 of FIG. 4. An IC package 530 encapsulates semiconductor substrate 400 and is electrically connected to bonding pads of semiconductor substrate 400 through internal bond wires, not shown in FIG. 5, as is well known in the art. As shown in FIG. 5 the main features of IC 500 include a vertical axis 510 separating a left portion from a right portion, a horizontal axis 520 separating a top portion from a bottom portion, corresponding approximately to dividing lines 410 and 420 of FIG. 4, respectively. Together axes 510 and 520 define four quadrants including a top left quadrant 540, a bottom left quadrant 550, a top right quadrant 570, and a bottom right quadrant 580. IC package 530 includes a notch or bevel in the outer surface of the encapsulant near the top left corner and a circle etched in the top surface near the top left corner to indicates that it is the pin 1 corner. In accordance with the bonding pad placement principles discussed above, IC 500 includes a pair of terminals 542 and 544 in a top left portion thereof radially connected through bond wires covered by the encapsulant to corresponding bonding pads 442 and 444 and conducting signals SIFOP and SIFON; a pair of terminals 552 and 554 in a bottom left portion thereof radially connected through bond wires covered by the encapsulant to corresponding bonding pads 452 and 454 and conducting signals SIFIP and SIFIN; a pair of terminals 572 and 574 in a top right portion thereof radially connected through bond wires covered by the encapsulant to corresponding bonding pads 472 and 474 and conducting signals TIFOP and TIFON; and a pair of terminals 582 and 584 in a bottom right portion thereof radially connected through bond wires covered by the encapsulant to corresponding bonding pads 482 and 484 and conducting signals TIFIP and TIFIN. In the specific example shown in FIG. 5, respectively, signals SIFON and SIFOP are conducted on package pins 1 and 2; signals SIFIN and SIFIP are conducted on package pins 15 and 16; signals TIFOP and TIFON are conducted on package pins 47 and 48; and signals TIFIP and TIFIN are conducted on package pins 33 and 34.

Considering FIGS. 4 and 5 together, IC 500 interfaces to an external SAW filter using bonding pads and corresponding package pins placed so as to maintain an input-to-output isolation of at least a predetermined amount. This predetermined amount corresponds to the stopband attenuation of the external SAW filter. So IC 500 separates differential output pin pair 442/444 from differential input pair 452/454 by a distance that, considering also their connection through bonding wires and respective package pins pairs 542/544 and 552/554, maintains at least −70 dB of isolation therebetween. Likewise IC 500 separates differential output pin pair 472/474 from differential input pair 482/484 by a distance that, considering also their connection through bonding wires and package pins pair 572/574 and 582/584, respectively maintains at least −70 dB of isolation therebetween. By providing these distances, the input-to-output signal coupling does not significantly degrade the performance of the corresponding receiver.

Several features of IC 500 preserve this isolation. First, semiconductor substrate 400 can be further separated into quadrants by a dividing line 420 that separates satellite receiver 430 into a top quadrant 440 and a bottom quadrant 450, and terrestrial receiver 460 into a top quadrant 470 and a bottom quadrant 480. The differential pin pairs are placed in separate quadrants to maintain isolation.

Furthermore by maintaining an isolation that corresponds to the characteristics of the external filter, the differential input and output pins of the satellite receiver can be formed on the left side and the differential input and output pins of the terrestrial receiver can be formed on the right side. Thus, IC layout can be simplified because the circuitry for the satellite receiver and for the terrestrial receiver can be laid out in mirror-image fashion with line 410 being the axis of symmetry. Note that line 410 is not completely straight because a small amount of circuitry is shared between both receivers, as will be explained more fully below.

The isolation can also be maintained by placing a certain number of other integrated circuit pins in between the differential pairs to establish a minimum distance of separation. Thus as shown in FIG. 4 there are fourteen intervening bond pads between output pins 442/444 and input pins 452/454 for satellite receiver 430, and eighteen intervening bond pads between output pins 472/474 and input pins 482/484 for terrestrial receiver 460. When connected to an integrated circuit package, the bond wires are placed approximately radially, maintaining approximately the same relative separation. Note that some bonding pads on semiconductor substrate 400 do not correspond one-to-one to pins of package 530: they may be unconnected such as for a test pin or unselected mode pin, two bonding pads may be bonded to a single package pin, bonding pads may be down bonded to a ground plane without having a corresponding integrated circuit pin, etc.

Another component of the isolation is the fact that the intervening pins include power and/or ground pins. These pins can provide a significant amount of signal shielding to increase the input-to-output isolation.

Finally IC 500 includes a satellite receiver that operates at an IF of 116.61 MHz and a terrestrial receiver that operates at a nearby IF of 113.505 MHz. Since their passbands overlap, IC 500 isolates the SAW filter inputs and outputs of the satellite receiver from either of those of the terrestrial receiver, and vice versa. Each pair of SAW filter input or output pins is located near a corner of the package to provide isolation from SAW filter connections associated with both receivers. Thus for example signal pair 442 and 444 has significant physical isolation from signal pair 472 and 474 as well as signal pair 452 and 454.

Complex RF modeling with a computer-aided-design (CAD) modeling program were used to estimate the actual input-to-output isolation. However the techniques discussed above, including placement in different quadrants, maintaining minimum distances, interposing multiple signal pins, and interposing power and/or ground pins contributed to providing sufficient input-to-output isolation.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit comprising:
a semiconductor substrate having a first pair of bonding pads for conducting a differential output signal thereon and configured to be coupled to an input of a first external filter, and a second pair of bonding pads for conducting a differential input signal thereon and configured to be coupled to an output of said first external filter; and
an integrated circuit package encapsulating said semiconductor substrate and having first and second terminal pairs corresponding and coupled to said first and second pairs of bonding pads, respectively,
wherein said first and second terminal pairs are separated by a first predetermined distance sufficient to maintain an input-to-output isolation attenuation therebetween of not less than a first stopband attenuation of the first external filter.

2. The integrated circuit of claim 1, wherein said first and second terminal pairs are located along a first side of said integrated circuit package and separated by a first plurality of intervening terminals.

3. The integrated circuit of claim 2, wherein said first plurality of intervening terminals comprises twelve terminals.

4. The integrated circuit of claim 2, wherein said first plurality of intervening terminals comprises at least one power supply terminal.

5. The integrated circuit of claim 2, wherein first and second terminals of said first terminal pair are adjacent to one another, and first and second terminals of said second terminal pair are adjacent to one another.

6. The integrated circuit of claim 5, wherein said first and second terminal pairs are located at opposite ends of said first side of said integrated circuit package.

7. The integrated circuit of claim 1, wherein:
said semiconductor substrate further has a third pair of bonding pads conducting a differential output signal thereon and configured to be coupled to an input of a second external filter, and a fourth pair of bonding pads conducting a differential input signal thereon and configured to be coupled to an output of said second external filter;
said integrated circuit package further has third and fourth terminal pairs corresponding and coupled to said third and fourth pairs of bonding pads, respectively; and
said third and fourth terminal pairs are separated by a second predetermined distance sufficient to maintain an input-to-output isolation attenuation therebetween of not less than a second stopband attenuation of said second external filter.

8. The integrated circuit of claim 7, wherein said first and second terminal pairs are located along a first side of said integrated circuit package and separated by a first plurality of intervening terminals and said third and fourth terminal pairs are located along a second side of said integrated circuit package and separated by a second plurality of intervening terminals.

9. The integrated circuit of claim 8, wherein said first and second pluralities of intervening terminals each comprises twelve terminals.

10. The integrated circuit of claim 8, wherein said first and second pluralities of intervening terminals each comprises at least one power supply terminal.

11. The integrated circuit of claim 8, wherein first and second terminals of each of said first, second, third, and fourth terminal pairs are adjacent to one another.

12. The integrated circuit of claim 8, wherein said first and second terminal pairs are located at opposite ends of said first side of said integrated circuit package and said third and fourth terminal pairs are located at opposite ends of said second side of said integrated circuit package.

13. An integrated circuit comprising:
a semiconductor substrate having first, second, third, and fourth quadrants having respective first, second, third, and fourth bonding pads located therein, said semiconductor substrate including a first circuit configured to be coupled to a first external filter coupled to said first circuit through said first and second bonding pads, and a second circuit configured to be coupled to a second external filter coupled to said second circuit through said third and fourth bonding pads; and
an integrated circuit package encapsulating said semiconductor substrate and having first, second, third, and fourth terminals corresponding and coupled to said first, second, third, and fourth bonding pads, respectively,
wherein said first terminal and said second terminal are separated by a first predetermined distance sufficient to maintain a first input-to-output isolation attenuation therebetween that is not less than a first stopband attenuation of the first external filter, and wherein said third terminal and said fourth terminal are separated by a second predetermined distance sufficient to maintain a second input-to-output isolation attenuation therebetween that is not less than a second stopband attenuation of the second external filter.

14. The integrated circuit of claim 13, wherein said first and second circuits comprise portions of radio frequency (RF) receivers.

15. The integrated circuit of claim 14, wherein said first circuit comprises a portion of a satellite receiver and said second circuit comprises a portion of a terrestrial receiver.

16. The integrated circuit of claim 14, wherein said first and second circuits have substantially the same layout.

17. The integrated circuit of claim 13, wherein said first and second circuits are configured to be coupled to first and second external surface acoustic wave (SAW) filters, respectively.

18. The integrated circuit of claim 13, wherein said semiconductor substrate further comprises fifth, sixth, seventh, and eighth bonding pads respectively located in said first, second, third, and fourth quadrants and forming complementary signal pairs with signals conducted on said first, second, third, and fourth bonding pads, respectively.

19. An integrated circuit comprising:
a semiconductor substrate having a first pair of bonding pads for conducting a differential output signal thereon and configured to be coupled to an input of an external filter, and a second pair of bonding pads for conducting a differential input signal thereon and configured to be coupled to an output of said external filter; and
an integrated circuit package encapsulating said semiconductor substrate and having at least first and second sides, and comprising a first pair of terminals located at a first end of said first side and coupled to said first pair of bonding pads, and a second pair of terminals located at a second end of said first side opposite said first end and coupled to said second pair of bonding pads, wherein said first pair of terminals and said second pair of terminals are separated by a predetermined distance sufficient to maintain an input-to-output isolation attenuation therebetween that not less than stopband attenuation of said external filter.

20. The integrated circuit of claim 19, wherein said integrated circuit package further comprises a thin quad flat package (TQFP).

21. The integrated circuit of claim 20, wherein said integrated circuit package further comprises a 64-lead TQFP.

22. The integrated circuit of claim 19, wherein said semiconductor substrate further has a third pair of bonding pads conducting a second differential output signal thereon and configured to be coupled to an input of a second external filter, and a fourth pair of bonding pads conducting a second differential input signal thereon and configured to be coupled to an output of said second external filter, and said integrated circuit package further has a third pair of terminals located on a first end of said second side and coupled to said third pair of bonding pads, and a fourth pair of terminals located on a second end of said second side opposite said first end and coupled to said fourth pair of bonding pads.

23. An integrated circuit comprising:
adjacent first and second terminals at a first end of a first side of the integrated circuit configured to be coupled to a differential input of a first external filter;
adjacent third and fourth terminals at a second end of said first side of the integrated circuit configured to be coupled to a differential output of said first external filter, wherein said adjacent first and second terminals and said adjacent third and fourth terminals are separated by a first predetermined distance sufficient to maintain an input-to-output isolation attenuation therebetween that not less than a first stopband attenuation of said first external filter;
adjacent fifth and sixth terminals at a first end of a second side of the integrated circuit configured to be coupled to a differential input of a second external filter; and
adjacent seventh and eighth terminals at a second end of said second side of the integrated circuit configured to be coupled to a differential output of said second external filter, wherein said adjacent fifth and sixth terminals and said adjacent seventh and eighth terminals are separated by a second predetermined distance sufficient to maintain an input-to-output isolation attenuation therebetween that is not less than a second stopband attenuation of said second external filter.

24. The integrated circuit of claim 23, wherein the integrated circuit comprises a quad flat package.

25. The integrated circuit of claim 24, wherein said quad flat package comprises sixty four terminals having corresponding pin numbers assigned consecutively around a periphery of said quad flat package starting from a pin one corner, and wherein said first and second terminals correspond to pins one and two, said third and fourth terminals correspond to pins fifteen and sixteen, said fifth and sixth terminals correspond to pins forty seven and forty eight, and said seventh and eighth terminals correspond to pins thirty three and thirty four.

26. The integrated circuit of claim 23, wherein each of said first and second external filters comprises a surface acoustic wave (SAW) filter.

\* \* \* \* \*

UNITED STATES PATENT AND TRADEMARK OFFICE
CERTIFICATE OF CORRECTION

| | | |
|---|---|---|
| PATENT NO. | : 8,222,721 B2 | Page 1 of 1 |
| APPLICATION NO. | : 10/691212 | |
| DATED | : July 17, 2012 | |
| INVENTOR(S) | : Andrew W. Dornbusch et al. | |

It is certified that error appears in the above-identified patent and that said Letters Patent is hereby corrected as shown below:

On the first page of the Issued Patent, in the Attorney, Agent, or Firm field, replace "Polarisky" with "Polansky".

In column 4, line 25, replace "Germany," with "Germany."

In column 4, line 33, replace "band for example" with "band, for example, in".

In column 8, line 65, insert --a-- between "than" and "stopband".

Signed and Sealed this
Ninth Day of October, 2012

David J. Kappos
*Director of the United States Patent and Trademark Office*